(12) United States Patent
Onggosanusi et al.

(10) Patent No.: US 7,180,955 B2
(45) Date of Patent: Feb. 20, 2007

(54) PARALLEL CONCATENATED TRELLIS-CODED MODULATION WITH ASYMMETRIC SIGNAL MAPPING

(75) Inventors: Eko N. Onggosanusi, Dallas, TX (US); Alan Gatherer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 802 days.

(21) Appl. No.: 09/919,191

(22) Filed: Jul. 31, 2001

(65) Prior Publication Data

US 2002/0025005 A1 Feb. 28, 2002

Related U.S. Application Data

(60) Provisional application No. 60/227,093, filed on Aug. 22, 2000.

(51) Int. Cl.
*H04L 5/12* (2006.01)
(52) U.S. Cl. .................................................. 375/265
(58) Field of Classification Search ................ 375/265, 375/260, 259, 240; 370/241, 310; 455/91, 455/130
See application file for complete search history.

(56) References Cited

U.S. PATENT DOCUMENTS 5,233,629 A * 8/1993 Paik et al. ................ 375/262
5,703,580 A * 12/1997 Ko ........................... 341/59
5,949,796 A 9/1999 Kumar
6,473,878 B1 * 10/2002 Wei ........................... 714/755

FOREIGN PATENT DOCUMENTS

| EP | 0 948 140 A1 | 10/1999 |
| EP | 0 986 181 A2 | 3/2000 |
| EP | 1 191 699 A1 | 3/2002 |

OTHER PUBLICATIONS

O. Takeshita, O. Collins, P. Massey, and D. Costello, "Asymmetric Turbo Codes," 1998 International Symposium on Information Theory (ISIT); Aug. 16-21, 1998, Cambridge, MA, p. 179.

S. Benedetto, D. Divsalar, G. Montorsi, and F. Pollara, "Parallel concatenated trellis coded modulation," Proc. 1996 *International Conference on Communications ICC*, pp. 974-978, 1996.

(Continued)

*Primary Examiner*—Pankaj Kumar
(74) *Attorney, Agent, or Firm*—Ronald O. Neerings; Wade James Brady, III; Frederick J. Telecky, Jr.

(57) ABSTRACT

Parallel concatenated trellis-coding modulation is accomplished by producing coded bits (21) from uncoded bits and also producing an interleaved version (22) of the coded bits from the uncoded bits. A first coded bits-to-signal mapping (mapping 1) is applied to the coded bits to produce a first output signal ($S_{11}$), and a second coded bits-to-signal mapping (mapping 2) is applied to the interleaved version of the coded bits to produce a second output signal ($S_{22}$), wherein the second coded bits-to-signal mapping differs from the first coded bits-to-signal mapping.

33 Claims, 5 Drawing Sheets

OTHER PUBLICATIONS

"Combined Multilevel Turbo-Code With 8PSK Modulation", K. Fazel and L. Papke, Globecom '95, IEEE Global Telecommunications Conference, Nov. 14-16, 1995, IEEE Global Telecommunications Conference (Globecom), New York, IEEE, US, vol. 1, Nov. 14, 1995, pp. 649-653, XP000621563, ISBN: 0-7803-2510-9.

"*A Note on Asymmetric Turbo-Codes*", Oscar Y. Takeshita, et al., IEEE Communications Letters, vol. 3, No. 3, Mar. 1999, pp. 69-71.

"*A Soft-Input soft Output APP Module for Iterative Decoding of Concatenated Codes*", S. Benedetto, Et al., IEEE Communications Letters, vol. 1, No. 1, Jan. 1997, pp. 22-24.

*Bandwidth-Efficient Turbo Trellis-Coded Modulation Using Punctured Component Codes*, Patrick Robertson, et al., IEEE Journal on Selected Areas in Communications, vol. 16, No. 2, Feb. 1998, pp. 206-218.

"*Design of Parallel Concatenated Convolutional Codes*", Serglo Benedetto, et al., IEEE Transaction son Communications, vol. 44, No. 5, May 1996, pp. 591-600.

"*On the Frame Error Rate of Turbo-Codes*", Oscar Y. Takeshita, et al., ITW 1998, Killarney, Ireland, 0-7803-4408-1/98/IEEE, 06/22-26, pp. 118-119.

"*Turbo-Codes and High Spectral Efficiency Modulation*", Stephane Le Goff, et al., Integrated Circuits for Telecommunications Laboratory, IEEE 0-7803-1825-0/94, IEEE 1994, pp. 645-649.

* cited by examiner

GRAY MAPPING

*FIG. 6*
*(PRIOR ART)*

0231 MAPPING

PARALLEL CONCATENATED TRELLIS-CODED MODULATION WITH ASYMMETRIC SIGNAL MAPPING

This application claims the priority under 35 USC 119(e)(1) of copending U.S. provisional application No. 60/227,093 filed on Aug. 22, 2000.

FIELD OF THE INVENTION

The invention relates generally to digital communications and, more particularly, to coding and modulation in digital communications.

BACKGROUND OF THE INVENTION

Each of the documents listed below is referred to herein by the corresponding number enclosed in square brackets to the left of the document. Each of these documents is also incorporated herein by reference.

[1] E. Biglieri, D. Divsalar, P. J. McLane, and M. K. Simon, *Introduction to Trellis Coded Modulation with Applications*. MacMillan, 1991.

[2] C. Berrou, A. Glavieux, and P. Thitimajshima, "Near Shannon limit error-correcting coding: Turbo codes," *Proc. 1993 IEEE International Conference on Communications ICC*, pp. 1064–1070, 1993.

[3] S. L. Goff, A. Glavieux, and C. Berrou, "Turbo-codes and high spectral efficiency modulation," *Proc. 1994 IEEE International Conference on Communications ICC*, pp. 645–649, 1993.

[4] A. J. Viterbi, E. Zehavi, R. Padovani, and J. K. Wolf, "A pragmatic approach to trellis-coded modulation," *IEEE Commun. Mag.*, pp. 11–19, July 1989.

[5] P. Robertson and T. Worz, "A novel bandwidth efficient coding scheme employing turbo codes," *Proc. 1996 IEEE International Conference on Communications ICC*, pp. 962–967, 1996.

[6] P. Robertson and T. Worz, "Bandwidth-efficient turbo trellis-coded modulation using punctured component codes," *IEEE JSAC*, pp. 206–218, February 1998.

[7] S. Benedetto, D. Divsalar, G. Montorsi, and F. Pollara, "Parallel concatenated trellis coded modulation," *Proc. 1996 IEEE International Conference on Communications ICC*, pp. 974–978, 1996.

[8] S. Benedetto and G. Montorsi, "Design of parallel concatenated convolutional codes," *IEEE Trans. Commun.*, pp. 591–600, May 1996.

[9] O. Y. Takeshita, O. M. Collins, P. C. Massey, and D. J. Costello, "On the frame error rate of turbo-codes," *Proceedings of ITW 1998*, pp. 118–119, June 1998.

[10] O. Y. Takeshita, O. M. Collins, P. C. Massey, and D. J. Costello, "A note on asymmetric turbo-codes," *IEEE Communications Letters*, vol. 3, pp. 69–71, March 1999.

[11] S. Benedetto, D. Divsalar, G. Montorsi, and F. Pollara, "A soft-input soft-output APP module for interative decoding of concatenated codes," *IEEE Commun. Lett.*, pp. 22–24, January 1997.

Trellis-Coded Modulation (TCM) has been demonstrated in [1] to offer a substantial coding gain without requiring bandwidth expansion. This is achieved by appropriate joint design of coding and modulation. Turbo codes, also known as parallel concatenated convolutional codes (PCCC), were initially proposed in [2], and have been known to attain very low error rates within the signal-to-noise ratio (SNR) range close to the Shannon limit. Attempts have therefore been made to combine TCM and turbo codes to obtain a class of powerful bandwidth-efficient coded modulation schemes. One such attempt was reported in [3]. The arrangement described in [3] uses the structure of the pragmatic TCM proposed in [4]. Schemes with improved performance were later proposed in [5], [6] and [7].

The original turbo code proposed in [2] utilizes two identical recursive systematic component codes (RSCCs) in parallel concatenation with an interleaver. This turbo code attains excellent bit-error rate (BER) for low SNR values. As the SNR increases, the BER drops very quickly. However, after a certain SNR value, there is a sudden reduction in the rate at which the BER drops. This phenomenon, referred to in [8], [9] and [10] is known as the "error floor".

It is demonstrated in [9] and [10] that the error floor for the original turbo code of [2] occurs at $10^{-5}$ for a length-16384 interleaver. Such an error floor is not desirable for high quality data communication applications such as, for example video communications for a wireless personal area network (WPAN). Such applications can require a BER of, for example, $10^{-8}$. Although the error floor for the original turbo code can be lowered, for example, by choosing a larger interleaver size, such an adjustment disadvantageously increases system complexity and latency.

Several attempts have been made to lower the error floor without increasing the interleaver size. For example, it is shown in [8] that the error floor can be lowered by choosing the feedback polynomial of the component codes to be primitive. This essentially increases the effective Hamming distance of the turbo code (which is known from [8] to be a good measure of code performance). However, as the error floor goes down, the BER in the low SNR region (referred to herein as the waterfall region) increases (see [9] and [10]).

Figure 1:
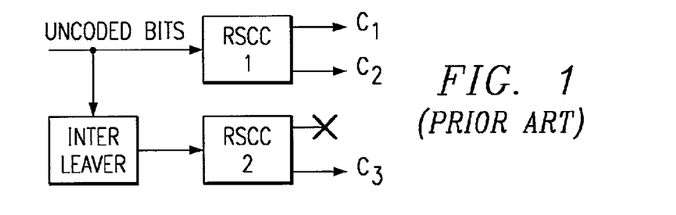
FIG. 1 diagrammatically illustrates a conventional PCCC system.

The authors of [9] and [10] attempted to provide for a trade-off between a low error floor and good performance in the waterfall region. In this regard, they suggested an asymmetric turbo coding structure wherein one component code has a non-primitive feedback polynomial (as in the original turbo code of [2]), and the other component code has a primitive feedback polynomial. An example of this coding structure, referred to in [9] and [10] as an asymmetric PCCC, is illustrated in FIG. 1. In the example of FIG. 1, the upper component code (RSCC 1) is a rate ½ RSCC with a primitive feedback polynomial, and the lower component code (RSCC 2) is a rate ½ RSCC with a non-primitive feedback polynomial. The systematic of the lower code is punctured, so the asymmetric PCCC produces coded bit outputs $C_1$ and $C_2$ from the upper branch and $C_3$ from the lower branch.

Figure 2:
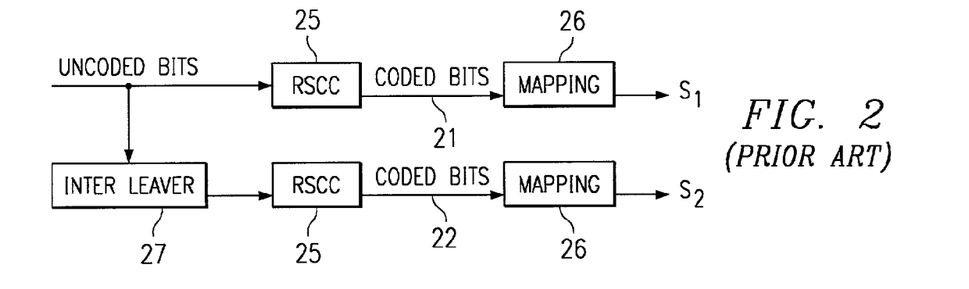
FIG. 2 diagrammatically illustrates a conventional PCTCM system.

FIG. 2 illustrates a conventional example of a parallel concatenated trellis-coded modulation (PCTCM) structure. In the example of FIG. 2, the RSCC 25 and mapping 26 for the upper and lower branches are identical. This type of structure is referred to herein as symmetric mapping PCTCM. In conventional structures such as shown in FIG. 2, the PCTCM is typically designed using the conventional approach of searching for a component code that has good properties for a given mapping (see [6] and [7]). Typical examples of conventional mappings that are used in arrangements like FIG. 2 include natural (set partitioning) mapping and Gray mapping. The coded bits from each component RSCC are mapped into signals $S_1$ and $S_2$ that take values within a constellation. For PCTCM, the search criterion is to maximize the effective Euclidean distance of the trellis code (see [7]). Like PCCC, PCTCM does not always provide a low enough error floor for some applications (such as the aforementioned video communication applications for WPAN). This can occur in PCTCM even when a component code that results in maximum effective Euclidean distance of the trellis code has been identified for a given mapping. This is especially true when an interleaver of moderate size is utilized.

Figure 3:
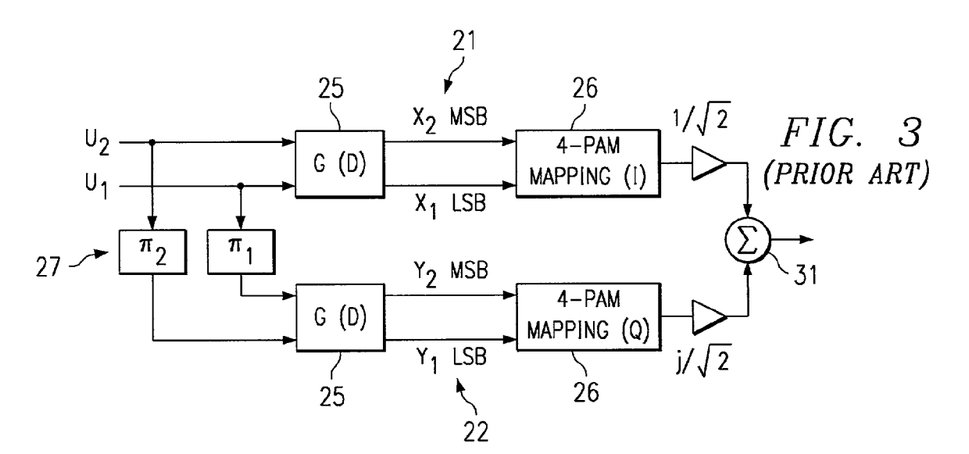
FIG. 3 diagrammatically illustrates a specific example of the conventional system of FIG. 2.
Figure 4:
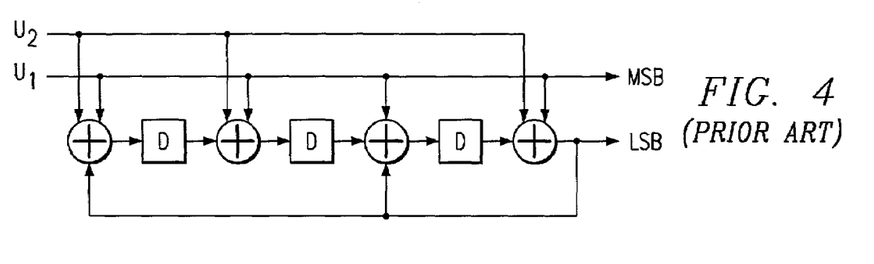
FIG. 4 illustrates a portion of the conventional system of FIG. 3 in more detail.
Figure 5:
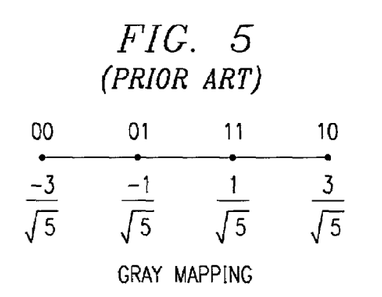
FIGS. 5 and 6 illustrate conventional examples of coded bit-to-signal mapping which can be utilized in the conventional systems of FIGS. 2 and 3.

FIG. 3 illustrates a specific example of the PCTCM structure shown in FIG. 2. The example of FIG. 3 is a 2 bps/Hz PCTCM system for 16-QAM. $U_1$ and $U_2$ represent uncoded bits from a communication application. The upper ($X_2$ and $X_1$) and lower ($Y_2$ and $Y_1$) coded bits are mapped onto a 4-PAM constellation to form in-phase (I) and quadrature (Q) components, which are combined (e.g. summed) at 31 to produce the 16-QAM signal. Two different length K-bit interleavers $\pi_1$ (for LSB $U_1$) and $\pi_2$ (for LSB $U_2$) are used in FIG. 3 to implement the interleaver section 27 of FIG. 2. As an example, K=4096. The rate-1 RSCC G(D) with maximum effective Euclidean distance for Gray mapping (see FIG. 5) is used. FIG. 4 illustrates an example of the G(D) of FIG. 3. In particular, the G(D) shown in FIG. 4 is the "best" 8 state RSCC G(D) for Gray mapping, and is disclosed in [7]. (The FIG. 4 G(D) was used for both transmitter branches in all simulations described herein.)

Figure 6:
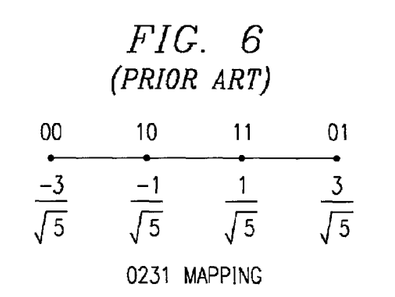

Another possibility for the mapping in FIG. 3 is conventional 0231 mapping, as illustrated in FIG. 6. Again, a search could be conducted for a RSCC G(D) with good properties for the 0231 mapping.

Figure 3A:
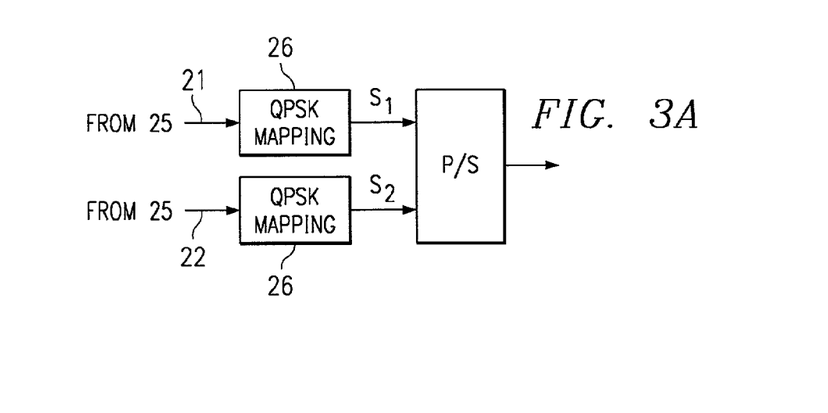
FIG. 3A illustrates another example of the system of FIG. 2.

FIG. 3A illustrates another example of the structure of FIG. 2. FIG. 3A uses identical QPSK (or 8PSK) mappings at 26, and the results of the mappings are applied to a parallel-to-serial converter before transmission.

In each of the examples of FIGS. 3 and 3A, the G(D) for one branch can differ from the G(D) for the other branch.

Figure 7:
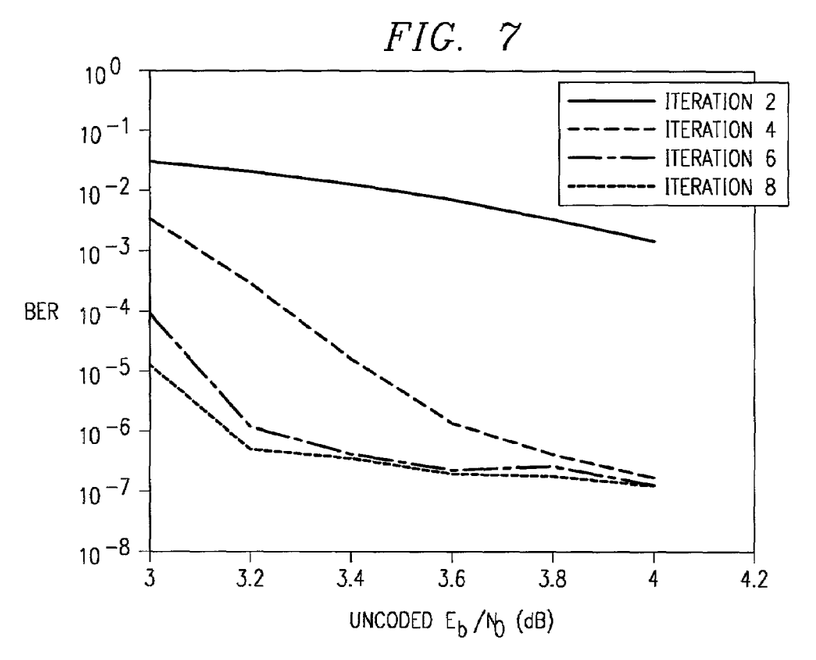
FIG. 7 illustrates exemplary simulation results for the system of FIG. 3 using the mapping of FIG. 5.
Figure 8:
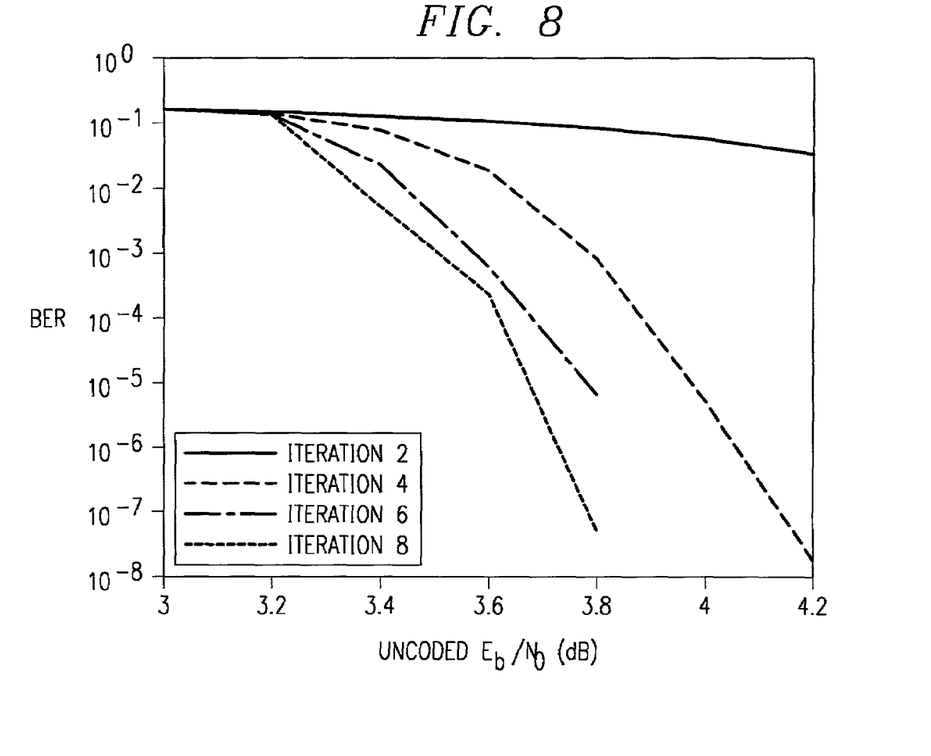
FIG. 8 illustrates exemplary simulation results for the system of FIG. 3 using the mapping of FIG. 6.

With respect to the example of FIG. 3, FIGS. 7 and 8 illustrate exemplary simulation results using Gray mapping and 0231 mapping, respectively, for $h_0=13$, $h_1=17$, $h_2=15$ and K=4096, and assuming an additive white Gaussian noise (AWGN) channel with a power spectral density of $N_0$. The simulations of FIGS. 7 and 8 plot the BER as a function of the uncoded SNR per bit, or $E_b/N_0$. The simulations of FIGS. 7 and 8 use the iterative MAP decoding algorithm for PCTCM found in [11], and results for 2, 4, 6 and 8 iterations are shown. In FIG. 7 (Gray mapping), the error floor occurs at around BER=$10^{-7}$. Thus, and although the Gray mapping system provides excellent performance in the waterfall region, nevertheless it does not meet the aforementioned requirement of BER=$10^{-8}$. In FIG. 8 (0231 mapping), the error floor is greatly reduced and is clearly below the aforementioned target of BER=$10^{-8}$. However, the BER in the waterfall region is significantly higher than in FIG. 7.

It is desirable in view of the foregoing to provide for a PCTCM system that can achieve acceptable performance in the waterfall region while also achieving an error floor that is acceptable for high quality data communication applications.

According to the invention, an error floor suitable for high quality data applications can be advantageously achieved in combination with acceptable performance in the waterfall region by providing an asymmetric PCTCM system including two component trellis code branches which utilize different coded bits-to-signal mappings.

BRIEF DESCRIPTION OF THE DRAWINGS

FIG. 11 graphically compares selected simulation results from FIGS. 7, 8 and 10.

DETAILED DESCRIPTION

Figure 9:
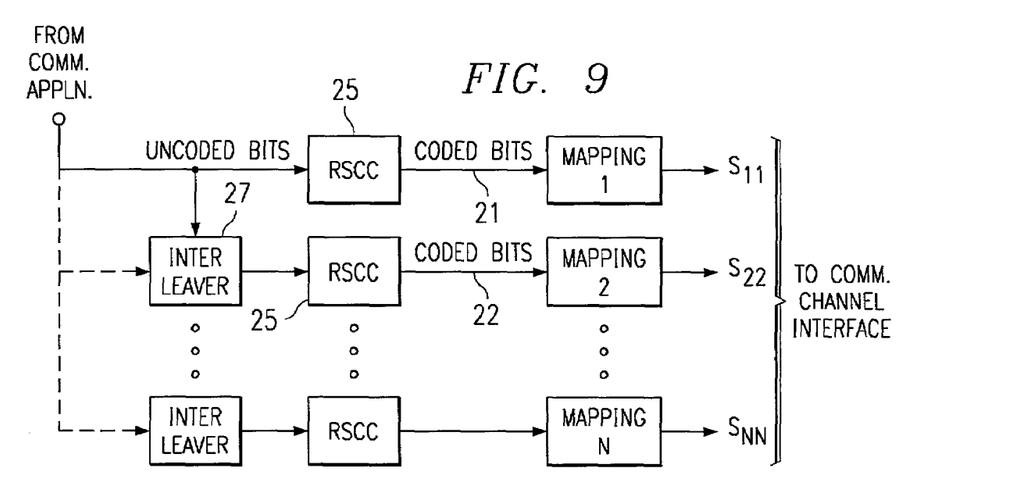
FIG. 9 diagrammatically illustrates exemplary embodiments of a PCTCM system according to the invention.

FIG. 9 diagrammatically illustrates exemplary embodiments of a PCTCM system according to the invention. In some embodiments, the coded bits of FIG. 9 can be produced in the same conventional fashion as illustrated in FIG. 2 or FIG. 3. However, in the system of FIG. 9, one branch uses a first coded bits-to-signal mapping (mapping 1) and the other branch uses a second coded bits-to-signal mapping (mapping 2) which is different than the first mapping. In some embodiments, mapping 1 is the 4-PAM Gray mapping described above which respect to FIGS. 3 and 5, and mapping 2 is the 4-PAM 0231 mapping described above with respect to FIGS. 3 and 6. As other examples, 6-PAM Gray mapping and 6-PAM 0231 mapping can be used. In other exemplary embodiments, first and second QPSK mappings (which differ from one another) can be used, or first and second 8PSK mappings (which differ from one another) can be used. By using different mappings for the different branches, the desired performance in the waterfall region can be advantageously balanced with the desired error floor.

The system of FIG. 9 can be used in any desired communication transmission apparatus, for example a wireless communication apparatus or a wireline communication apparatus. The system of FIG. 9 receives the uncoded bits from a communication application (for example a video application for WPAN) associated with the transmission apparatus. In embodiments that use 4-PAM or 6-PAM mappings (see FIG. 9A), the output signals $S_{11}$ and $S_{22}$ can be combined (as in FIG. 3) to produce a 16-QAM signal for output to a communication channel interface which interfaces the 16-QAM signal to a communication channel. Any desired mappings other than 4-PAM (or 6-PAM) Gray and 4-PAM (or 6-PAM) 0231 mappings can be used for mapping 1 and mapping 2 in FIG. 9A. For example, 4-PAM (or 6-PAM) 0213 mapping can be combined with 4-PAM (or 6-PAM) Gray or 0231 mapping. In embodiments that use first and second QPSK or 8PSK mappings (see FIG. 9B), a parallel-to-serial converter can be used (as in FIG. 3A) to format the signals $S_{11}$ and $S_{22}$ for a suitable communication channel interface.

Referring again to FIG. 9, as shown by broken line, the architecture can be extended to any desired number (N) of branches and mappers. In some embodiments, the transmission apparatus can be a wireless transmission apparatus such as provided in wireless telephones, laptop computers, personal digital assistants, etc.

Figure 9A:
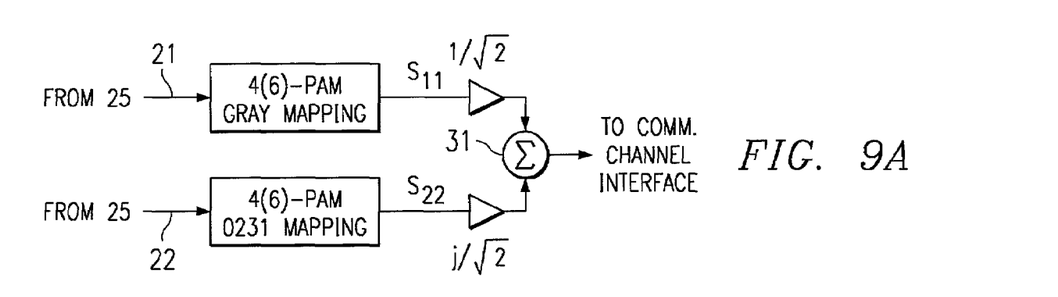
FIGS. 9A and 9B diagrammatically illustrate specific examples of the FIG. 9 system.
Figure 9B:
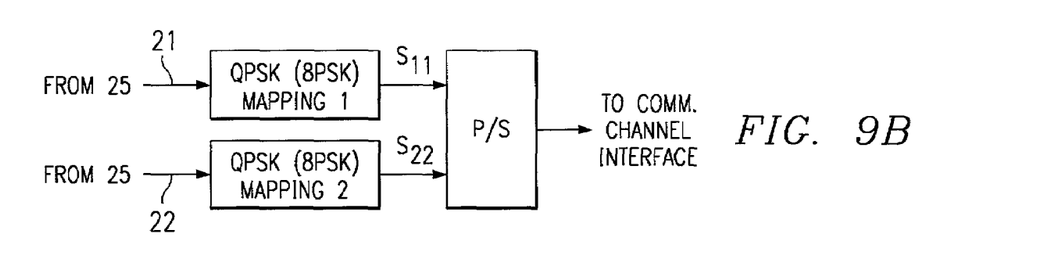

In each of the examples shown in FIGS. 9, 9A and 9B, the RSCC G(D) for one branch can be the same as or different from the RSCC G(D) for the other branch. For example, a code that is optimal for one of the mappings could be chosen for both mappings, or the optimal code for each mapping can be used with its associated mapping, or a single code for both mappings could be chosen arbitrarily, or one or two codes could be chosen empirically based on experimentation.

A suitable wireless or wireline communication receiver for receiving the signals transmitted by the transmission apparatus embodiments of FIGS. 9, 9A and 9B can be readily implemented, for example, by modifying conventional receivers associated with the transmitters of FIGS. 2–3A to account for the fact that the PCTCM structure of FIGS. 9, 9A and 9B utilizes different coded bits-to-signal mappings in the respective branches thereof.

Figure 10:
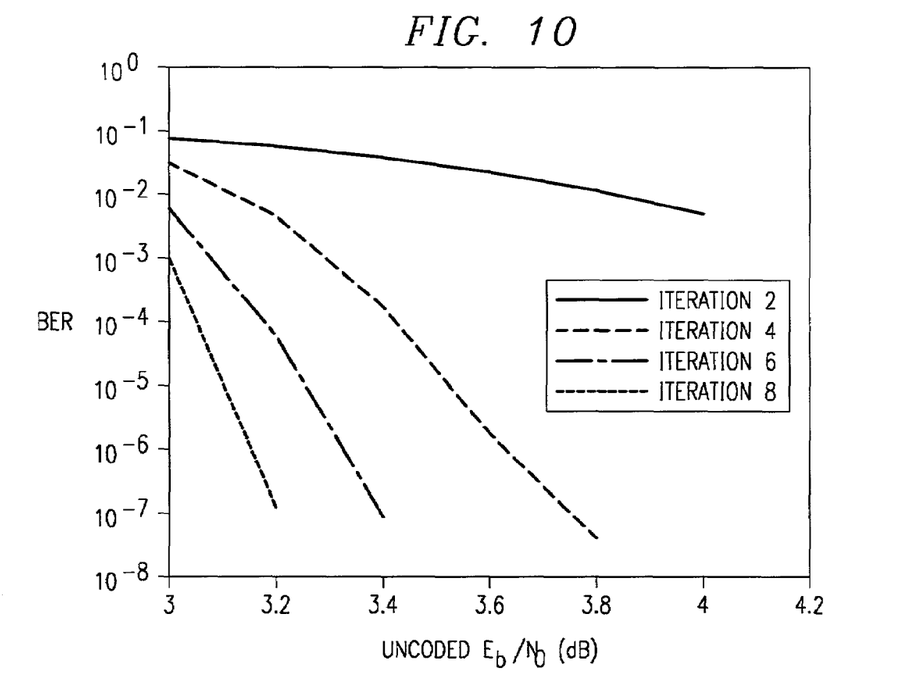
FIG. 10 illustrates exemplary simulation results for the system of FIG. 9.

FIG. 10 illustrates simulation results associated with one example of the system of FIG. 9. FIG. 10 illustrates the relationship between BER and SNR for a 2 bps/Hz PCTCM system for 16-QAM. As discussed above with respect to FIGS. 7 and 8, the iterative MAP decoding algorithm for PCTCM found in [11] is used, and results for 2, 4, 6 and 8 decoding iterations are illustrated. Also as in the simulations of FIGS. 7 and 8 above, $h_0=13$, $h_1=17$, $h_2=15$ and the interleaver length K=4096.

Comparing FIG. 10 with FIG. 7, it can be seen that the asymmetric mapping system of FIG. 9 lowers the error floor from $10^{-7}$ to below $10^{-8}$ as compared to the symmetric Gray mapping system results of FIG. 7. Comparison of FIG. 10 with FIG. 8 indicates that the asymmetric mapping system of FIG. 9 realizes only a marginal performance loss of approximately 0.2 dB in the waterfall region as compared to the symmetric 0231 mapping results illustrated in FIG. 8.

Figure 11:
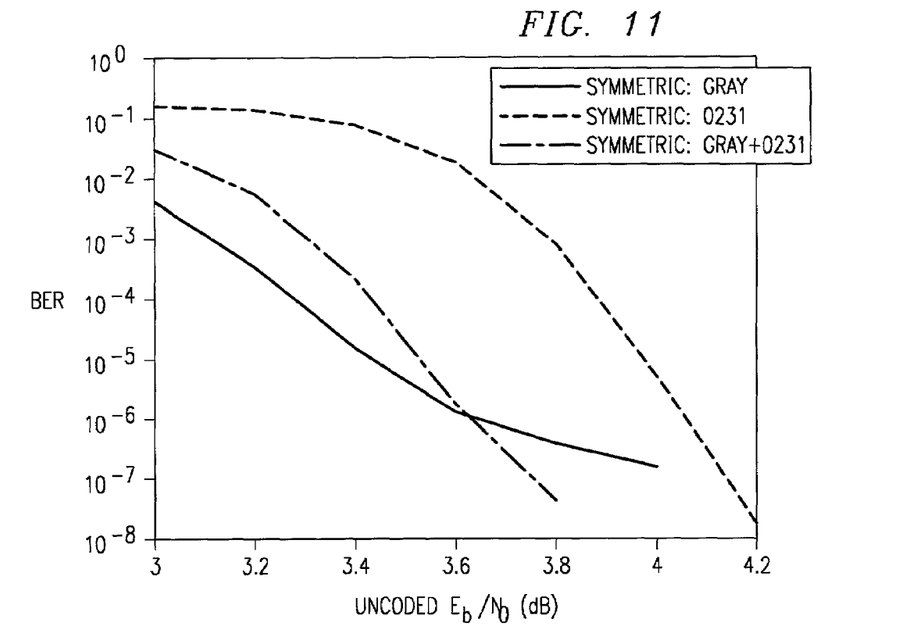

FIG. 11 provides a graphical comparison of the $4^{th}$ iteration results from the symmetric Gray mapping of FIG. 7, the symmetric 0231 mapping of FIG. 8 and the asymmetric mapping of FIG. 10. As shown in FIG. 11, the asymmetric mapping of the present invention outperforms the symmetric Gray mapping with respect to error floor, while experiencing only a marginal performance loss in the waterfall region with respect to the symmetric 0231 mapping of FIG. 8.

In the examples of FIGS. 9, 9A and 9B, mapping 1 and mapping 2 are essentially used in the same frequency. However, as illustrated in the exemplary embodiments of FIG. 12, mapping 1 and mapping 2 need not be used in the same frequency. Moreover, as shown in FIG. 12, both mapping 1 and mapping 2 can be used to produce the signal $S_{11}$, and both mapping 1 and mapping 2 can be used to produce the signal $S_{22}$.

Figure 12:
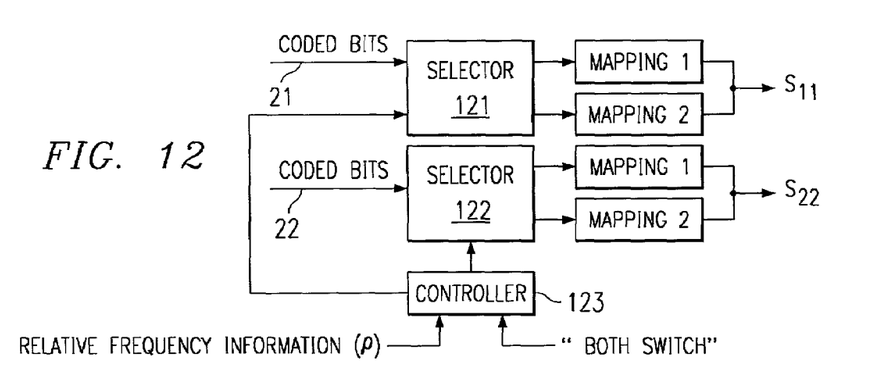
FIG. 12 diagrammatically illustrates further exemplary embodiments of a PCTCM system according to the invention.

In the example of FIG. 12, the coded bits at 21 and the interleaved version of the coded bits at 22 are input to respective selectors 121 and 122. These selectors are responsive to control signals received from a controller 123 for routing their associated coded bits to either a mapper that performs mapping 1 or a mapper that performs mapping 2. Thus, signal $S_{11}$ can be produced using both mapping 1 and mapping 2, and signal $S_{22}$ can similarly be produced using both mapping 1 and mapping 2. The controller 123 receives relative frequency information and controls the selectors 121 and 122 appropriately in response to this information, so that the signals $S_{11}$ and $S_{22}$ reflect the desired relative frequency combination of mapping 1 and mapping 2. The relative frequency information can, in some embodiments, include a relative frequency parameter $\rho$. This relative frequency parameter can be used to control a trade-off between waterfall performance and error floor performance. Different values of $\rho$ that respectively correspond to different combinations of waterfall/error floor performance can be determined, for example, from simulations and/or experimental observations, and the values of $\rho$ can then be stored, for example, in a look-up table, indexed against the corresponding combinations of waterfall/error floor performance.

Figure 13:
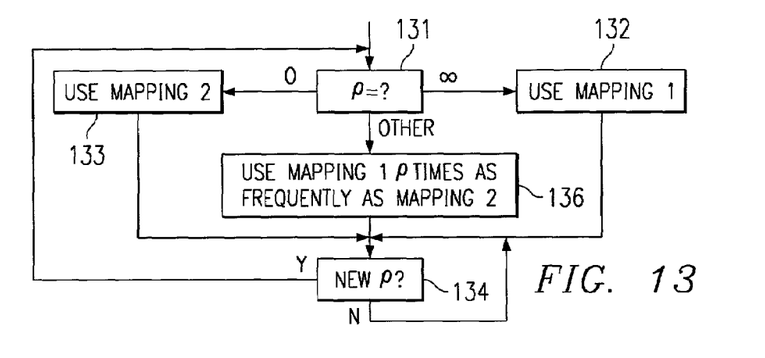
FIG. 13 illustrates exemplary operations which can be performed by the PCTCM system of FIG. 12.

FIG. 13 illustrates exemplary operations which can be performed by the system of FIG. 12 to produce the signals $S_{11}$ and $S_{22}$. At 131, the value of $\rho$ is determined. If $\rho=\infty$, then at 132 only mapping 1 is used for both $S_{11}$ and $S_{22}$ (conventional symmetric mapping for mapping 1), until a new value of $\rho$ is provided at 134. If $\rho=0$, then at 133 only mapping 2 is used for both $S_{11}$ and $S_{22}$ (conventional symmetric mapping for mapping 2), until a new value of $\rho$ is provided at 134. If $\rho$ is neither 0 nor $\infty$, then at 136, mapping 1 is used $\rho$ times as frequently as is mapping 2, until a new value of $\rho$ is provided at 134. For example, if $\rho=3$, then mapping 1 can be used exclusively to produce $S_{11}$ in FIG. 12, while controller 123 controls selector 122 such that mapping 1 and mapping 2 can be used alternately to produce alternate symbols of $S_{22}$. If $\rho=\frac{1}{3}$, then, for example, mapping 2 can be used exclusively for $S_{22}$ while mapping 1 and mapping 2 are used alternately to produce alternate symbols of $S_{11}$.

Note, for example, that when each mapping is to be used in the same frequency ($\rho=1$), this can be realized, for example, by using only mapping 1 to produce $S_{11}$ and using only mapping 2 to produce $S_{22}$. However, in some embodiments, the controller 123 can control the selectors such that each of the signals $S_{11}$ and $S_{22}$ is produced using both mapping 1 and mapping 2. In such embodiments, each mapping can be used in the same frequency ($\rho=1$), for example, by using mapping 1 and mapping 2 alternately to produce alternate symbols in $S_{11}$, and correspondingly using mapping 2 and mapping 1 alternately to produce alternate symbols in $S_{22}$. That is, the symbol mapping sequence for $S_{11}$ would be mapping 1, mapping 2, mapping 1, mapping 2, etc., while the timewise corresponding sequence for $S_{22}$ would be mapping 2, mapping 1, mapping 2, mapping 1, etc. In general, a "both switch" signal can be activated at an input of the controller 123 to indicate that both mapping 1 and mapping 2 are to be used to produce each of the signals $S_{11}$, and $S_{22}$. The controller 123 then controls the selectors 121 and 122 such that both mappings are used to produce both signals $S_{11}$, and $S_{22}$, while still complying with the relative frequency parameter $\rho$. Any desired symbol mapping sequences can be used for $S_{11}$, and $S_{22}$, provided that they comply with the selected value of $\rho$.

It will be apparent to workers in the art that the invention described above can be readily implemented by suitable modifications in software, hardware or a combination of software and hardware in conventional communication transmission and receiver stations.

Although exemplary embodiments of the invention are described above in detail, this does not limit the scope of the invention, which can be practiced in a variety of embodiments.

What is claimed is:

1. A communication transmission apparatus, comprising:
a first input for receiving coded bits;
a second input for receiving an interleaved version of said coded bits;
a first mapper coupled to said first input for applying a first coded bits-to-signal mapping to said coded bits to produce a first output signal, wherein said first coded bits-to-signal mapping is one of Gray mapping, 0231 mapping and 0213 mapping;
a second mapper coupled to said second input for applying a second coded bits-to-signal mapping to the interleaved version of said coded bits to produce a second output signal, wherein said second coded bits-to-signal mapping differs from said first coded bits-to-signal mapping; and
a communication channel interface coupled to said mappers for interfacing said output signals to a communication channel.

2. The apparatus of claim 1, wherein said communication channel interface Is a wireless communication channel interface.

3. The apparatus of claim 1, provided as one of a wireless telephone, a laptop computer and a personal digital assistant.

4. The apparatus of claim 1, wherein said second coded bits-to-signal mapping is another of Gray mapping, 0231 mapping and 0213 mapping.

5. The apparatus of claim 1, wherein said first mapping is set partition mapping.

6. The apparatus of claim 1, wherein said first mapper and said second mapper each implement one of QPSK mapping and 8PSK mapping.

7. The apparatus of claim 1, wherein said communication channel interface includes a combiner coupled to said first and second mappers for combining said fist and second output signals to produce a combined output signal for interfacing to the communication channel.

8. The apparatus of claim 1, wherein said first mapper and said second mapper each implement one of 4-PAM mapping and 6-PAM mapping.

9. The apparatus of claim 1, including a third mapper coupled to said fist input for applying a third coded bits-to-signal mapping to said coded bits to produce said first output signal, wherein said third coded bits-to-signal mapping differs from said first coded bits-to-signal mapping, and further including a selection apparatus connected between said first input and said first and third mappers for selecting one of said first and third mappers to apply its associated coded bits-to-signal mapping to said coded bits to produce said first output signal.

10. The apparatus of claim 9, wherein said third coded bits-to-signal mapping is the same as said second coded bits-to-signal mapping.

11. The apparatus of claim 10, wherein said selection apparatus includes an input for receiving information indicative of a relative frequency with which said first and second coded bits-to-signal mappings are to be applied to produce said output signals, said selection apparatus responsive to said relative frequency information for switching between said first and third mappers to implement said relative frequency.

12. The apparatus of claim 1, including a third mapper coupled to said second input for applying a third coded bits-to-signal mapping to the interleaved version of said coded bits to produce said second output signal, wherein said third coded bits-to-signal mapping differs from said second coded bits-to-signal mapping, and further including a selection apparatus connected between maid second input and said second and third mappers for selecting one of said second and third mappers to apply its associated coded bits-to-signal mapping to the interleaved version of said coded bits to produce said second output signal.

13. The apparatus of claim 12, wherein said third coded bits-to-signal mapping is the same as said first coded bits-to-signal mapping.

14. The apparatus of claim 13, wherein said selection apparatus includes an input for receiving information indicative of a relative frequency with which said second and first coded bits-to-signal mappings are to be applied to produce said output signal, said selection apparatus responsive to said relative frequency information for switching between said second and third mappers to implement said relative frequency.

15. A parallel concatenated trellis-coded modulation apparatus, comprising:
an input for receiving uncoded bits from a communication application;
a first coder coupled to said input for producing coded bits from said uncoded bits;
an interleaver coupled to said input for producing from said uncoded bits an interleaved version of said uncoded bits;
a second coder coupled to said interleave for producing an interleaved version of said coded bits from the interleaved version of said uncoded bits;
a first mapper coupled to said first coder for applying a first coded bits-to-signal mapping to said coded bits to produce a first output signal, wherein said first ended bits-to-signal mapping is one of Gray mapping, 0231 mapping and 0213 mapping; and
a second mapper coupled to said second coder for applying a second coded bits-to-signal mapping to the interleaved version of said coded bits to produce a second output signal, wherein said second coded bits-to-signal mapping differs from said first coded bits-to-signal mapping.

16. The apparatus of claim 15, wherein said interleaver includes first and second interleaver portions for respectively interleaving most significant bits and least significant bits of said uncoded bits, and wherein said first and second interleaver portions are different length interleaver portions.

17. The apparatus of claim 16, wherein said first and second interleaver portions are 4096-bit interleaver portions.

18. The apparatus of claim 15, wherein said first and second coders each implement an identical recursive systematic component code.

19. The apparatus of claim 15, wherein said second coded bits-to-signal mapping is another of Gray mapping, 0231 mapping and 0213 mapping.

20. The apparatus of claim 15, wherein said first mapping is set partition mapping.

21. The apparatus of claim 15, wherein said first mapper and said second mapper each implement one of QPSK mapping md 8PSK mapping.

22. The apparatus of claim 15, wherein said first mapper and said second mapper each implement one of 4-PAM mapping and 6-PAM mapping.

23. A communication transmission method in an apparatus, comprising:
receiving coded bits and an interleaved version of said coded bits;
applying a first coded bits-to-signal mapping to said coded bits to produce a first output signal;

applying a second coded bits-to-signal mapping to the interleaved version of said coded bits to produce a second output signal, wherein said second coded bits-to-signal mapping differs from said first coded bits-to-signal mapping;

applying a third coded bits-to-signal mapping to said code bits to produce said first output signal, wherein said third coded bits-to-signal mapping differs from said first coded bits-to-signal mapping, and further including selectively applying one of said first and third coded bits-to-signal mappings to said coded bits to produce said first output signal; and interfacing said output signals to a communication channel.

24. The method of claim 23, wherein said interfacing step includes interfacing said output signals to a wireless communication channel.

25. The method of claim 23, wherein said third coded bits-to-signal mapping is the same as said second coded bits-to-signal mapping.

26. The method of claim 25, including receiving information indicative of a relative frequency with which said first and second coded bits-to-signal mappings are to be applied to produce said output signals, and said selectively applying step including switching between said first and third coded bits-to-signal mappings to implement said relative frequency.

27. The method of claim 23, wherein said interfacing step includes combining said first and second output signals to produce a combined output signal for interfacing to the communication channel.

28. A communication transmission method in an apparatus, comprising:

receiving coded bits and an interleaved version of said coded bits;

applying first coded bits-to-signal mapping to said coded bits to produce a first output signal;

applying a second coded bits-to-signal manning to the interleaved version of said coded bits to produce a second output signal, wherein said second coded bits-to-signal mapping differs from said first coded bits-to-signal mapping;

applying a third coded bits-to-signal mapping to the interleaved version of said coded bits to produce said second output signal, wherein said third coded bits-to-signal mapping differs from said second coded bits-to-signal mapping, and further including selectively applying said second and third coded bits-to-signal mappings to the interleaved version of said coded bits to produce said second output signal; and interfacing said output signals to a communication channel.

29. The method of claim 28, wherein said third coded bits-to-signal mapping is the same as said first coded bits-to-signal mapping.

30. The method of claim 29, including receiving information indicative of a relative frequency with which said second and first coded bits-to-signal mappings are to be applied to produce said output signals, and said selectively applying step including switching between said second and third coded bits-to-signal mappings to implement said relative frequency.

31. A method of performing parallel concatenated trellis-coded modulation in an apparatus, comprising:

receiving uncoded bits from a communication application;

encoding said uncoded bits to produce coded bits;

interleaving said uncoded bits to produce an interleaved version of said uncoded bits, wherein said interleaving step includes using a first interleaving operation for interleaving most significant bits of said uncoded bits and using a second interleaving operation for interleaving least significant bits of said uncoded bits, wherein said first and second interleaving operations are different length interleaving operations;

encoding the interleaved version of said uncoded bits to produce an interleaved version of said coded bits;

applying a first coded bits-to-signal mapping to said coded bits to produce a first output signal; and applying a second coded bits-to-signal mapping to the interleaved version of said coded bits to produce a second output signal, wherein said second coded bits-to-signal mapping differs from said first coded bits-to-signal mapping.

32. The method of claim 31, wherein said first and second interleaving operations are each 4096-bit interleaving operations.

33. The method of claim 31, wherein said encoding steps each implement an identical recursive systematic component code.

* * * * *